(12) United States Patent
Linton (10) Patent No.: US 9,534,313 B2
(45) Date of Patent: Jan. 3, 2017

(54) PARTICLES INCLUDING NANOPARTICLES DISPERSED IN SOLID WAX, METHOD AND USES THEREOF

(75) Inventor: John R. Linton, Concord, MA (US)

(73) Assignee: QD VISION, INC., Lexington, MA (US)

(*) Notice: Subject to any disclaimer, the term of this patent is extended or adjusted under 35 U.S.C. 154(b) by 46 days.

(21) Appl. No.: 12/874,357

(22) Filed: Sep. 2, 2010

(65) Prior Publication Data

US 2011/0081538 A1    Apr. 7, 2011

Related U.S. Application Data

(60) Provisional application No. 61/033,729, filed on Mar. 4, 2008.

(51) Int. Cl.
| | | |
|---|---|---|
| *B32B 5/16* | (2006.01) | |
| *C08L 91/06* | (2006.01) | |
| *C30B 7/08* | (2006.01) | |
| *C08J 3/12* | (2006.01) | |
| *C30B 29/46* | (2006.01) | |
| *C30B 29/60* | (2006.01) | |
| *B82Y 30/00* | (2011.01) | |

(52) U.S. Cl.
CPC ............... *C30B 7/08* (2013.01); *C08J 3/126* (2013.01); *C08L 91/06* (2013.01); *C30B 29/46* (2013.01); *C30B 29/60* (2013.01); *B82Y 30/00* (2013.01); *Y10T 428/25* (2015.01); *Y10T 428/2991* (2015.01)

(58) Field of Classification Search
CPC .............. C08L 9/06; C08J 3/126; B82Y 30/00
USPC .......... 428/403, 407, 1.1, 323, 327; 106/230
See application file for complete search history.

(56) References Cited

U.S. PATENT DOCUMENTS

| | | |
|---|---|---|
| 3,872,040 A | 3/1975 | Mollohan et al. |
| 4,738,798 A | 4/1988 | Mahler |
| 5,064,718 A | 11/1991 | Buscall et al. |
| 5,091,115 A | 2/1992 | Nogami |
| 5,300,538 A | 4/1994 | Loftin |
| (Continued) | | |

FOREIGN PATENT DOCUMENTS

| | | |
|---|---|---|
| JP | H0950057 | 2/1997 |
| WO | WO 03060142 | 7/2003 |
| WO | WO 2009145813 | 12/2009 |

OTHER PUBLICATIONS

Bin, X. et al., "High-quality CdTe Quantum Dots Synthesized in Liquid Paraffin Wax", *ISSN*, 2008 29 (2) Abstract.
(Continued)

*Primary Examiner* — Holly Le (57) ABSTRACT

The present invention relates to nanoparticles encapsulated within a host material. In one embodiment, a particle comprises a host material including nanoparticles with light-transmissive properties dispersed therein. Other embodiments relate to a powder comprising a particle of the invention, a composition including a particle of the invention, a formulation including a particle of the invention, a coating comprising a particle of the invention, a method for making a particle of the invention, and products and applications including a particle of the invention. In preferred embodiments, a nanoparticle comprises a semiconductor nanocrystal. In preferred embodiments, a host material comprises a wax.

8 Claims, 1 Drawing Sheet

(56) References Cited

U.S. PATENT DOCUMENTS

| | | |
|---|---|---|
| 5,356,617 A | 10/1994 | Schlossman |
| 5,422,489 A | 6/1995 | Bhargava |
| 5,434,878 A | 7/1995 | Lawandy |
| 5,442,254 A | 8/1995 | Jaskie |
| 5,448,582 A | 9/1995 | Lawandy |
| 5,464,696 A | 11/1995 | Tournier et al. |
| 5,470,910 A | 11/1995 | Spanhel |
| 5,527,386 A | 6/1996 | Statz |
| 5,751,018 A | 5/1998 | Alivisatos et al. |
| 5,906,670 A | 5/1999 | Dobson et al. |
| 6,023,371 A | 2/2000 | Onitsuka et al. |
| 6,103,379 A | 8/2000 | Margel et al. |
| 6,251,303 B1 | 6/2001 | Bawendi et al. |
| 6,259,506 B1 | 7/2001 | Lawandy |
| 6,309,701 B1 | 10/2001 | Barbera-Guillem et al. |
| 6,322,901 B1 | 11/2001 | Bawendi et al. |
| 6,358,652 B1 | 3/2002 | Tomiuchi et al. |
| 6,391,406 B1 | 5/2002 | Zenner et al. |
| 6,464,898 B1 | 10/2002 | Tomoike et al. |
| 6,501,091 B1 | 12/2002 | Bawendi et al. |
| 6,528,165 B2 | 3/2003 | Chandler |
| 6,548,171 B1 | 4/2003 | Barbera-Guillem et al. |
| 6,552,290 B1 | 4/2003 | Lawandy |
| 6,576,155 B1 | 6/2003 | Barbera-Guillem |
| 6,602,671 B1 | 8/2003 | Bawendi et al. |
| 6,633,370 B2 | 10/2003 | Lawandy |
| 6,652,967 B2 | 11/2003 | Yadav et al. |
| 6,660,381 B2 | 12/2003 | Halas et al. |
| 6,680,211 B2 | 1/2004 | Barbera-Guillem et al. |
| 6,703,781 B2 | 3/2004 | Zovko |
| 6,721,083 B2 | 4/2004 | Jacobson et al. |
| 6,726,992 B1 | 4/2004 | Yadav et al. |
| 6,731,359 B1 | 5/2004 | Fukaya |
| 6,773,812 B2 | 8/2004 | Chandler et al. |
| 6,783,569 B2 | 8/2004 | Cheon et al. |
| 6,791,259 B1 | 9/2004 | Stokes et al. |
| 6,814,760 B2 | 11/2004 | Anderson et al. |
| 6,819,845 B2 | 11/2004 | Lee et al. |
| 6,835,326 B2 | 12/2004 | Barbera-Guillem |
| 6,870,311 B2 | 3/2005 | Mueller et al. |
| 6,876,796 B2 | 4/2005 | Garito et al. |
| 6,899,827 B2 | 5/2005 | Lauf et al. |
| 6,905,766 B2 | 6/2005 | Chandler |
| 6,906,339 B2 | 6/2005 | Dutta |
| 6,914,106 B2 | 7/2005 | Leon et al. |
| 6,924,596 B2 | 8/2005 | Sato et al. |
| 6,957,608 B1 | 10/2005 | Hubert et al. |
| 7,008,559 B2 | 3/2006 | Chen |
| 7,032,664 B2 | 4/2006 | Lord et al. |
| 7,045,956 B2 | 5/2006 | Braune et al. |
| 7,065,285 B2 | 6/2006 | Chen et al. |
| 7,073,965 B2 | 7/2006 | Look |
| 7,083,889 B2 | 8/2006 | Yamazaki et al. |
| 7,102,152 B2 | 9/2006 | Chua et al. |
| 7,115,216 B2 | 10/2006 | Carter et al. |
| 7,115,688 B1 | 10/2006 | Mirken et al. |
| 7,160,613 B2 | 1/2007 | Bawendi |
| 7,182,938 B2 | 2/2007 | Andre et al. |
| 7,205,048 B2 | 4/2007 | Naasani |
| 7,208,122 B2 | 4/2007 | Swager et al. |
| 7,229,690 B2 | 6/2007 | Chan et al. |
| 7,265,488 B2 | 9/2007 | Ng et al. |
| 7,279,832 B2 | 10/2007 | Thurk et al. |
| 7,316,809 B2 | 1/2008 | L'Alloret |
| 7,326,365 B2 | 2/2008 | Bawendi et al. |
| 7,374,807 B2 | 5/2008 | Parce et al. |
| 7,449,237 B2 | 11/2008 | Chan et al. |
| 7,470,731 B2 | 12/2008 | Sanchez et al. |
| 7,479,516 B2 | 1/2009 | Chen et al. |
| 7,495,383 B2 | 2/2009 | Chua et al. |
| 7,553,683 B2 | 6/2009 | Martin et al. |
| 7,659,224 B2 | 2/2010 | Shimazaki et al. |
| 7,671,096 B2 | 3/2010 | Hosaka et al. |
| 7,723,744 B2 | 5/2010 | Gillies et al. |
| 7,732,806 B2 | 6/2010 | Yoshimura et al. |
| 7,767,017 B2 | 8/2010 | Lahann et al. |
| 7,829,162 B2 | 11/2010 | Eskra |
| 7,857,141 B2 | 12/2010 | Park et al. |
| 7,862,892 B2 | 1/2011 | Bawendi et al. |
| 8,128,249 B2 | 3/2012 | Skipor et al. |
| 8,354,785 B2 | 1/2013 | Clough et al. |
| 8,377,333 B2 | 2/2013 | Ramprasad et al. |
| 2001/0034034 A1 | 10/2001 | Bruchez et al. |
| 2002/0071948 A1 | 6/2002 | Duff et al. |
| 2002/0098217 A1* | 7/2002 | Piot et al. .................. 424/401 |
| 2002/0157574 A1 | 10/2002 | Weitzel et al. |
| 2003/0030706 A1 | 2/2003 | Jagannathan et al. |
| 2003/0031438 A1 | 2/2003 | Kambe et al. |
| 2003/0082237 A1 | 5/2003 | Cha et al. |
| 2003/0106160 A1 | 6/2003 | Sun et al. |
| 2003/0132538 A1* | 7/2003 | Chandler .................. 264/4.1 |
| 2003/0175411 A1 | 9/2003 | Kodas et al. |
| 2004/0007169 A1 | 1/2004 | Ohtsu et al. |
| 2004/0095658 A1 | 5/2004 | Buretea et al. |
| 2004/0131789 A1 | 7/2004 | Brown |
| 2005/0012076 A1 | 1/2005 | Morioka |
| 2005/0058416 A1 | 3/2005 | Lee et al. |
| 2005/0068154 A1* | 3/2005 | Beste et al. .................. 340/7.2 |
| 2005/0100807 A1 | 5/2005 | Yamazaki et al. |
| 2005/0112376 A1 | 5/2005 | Naasani |
| 2005/0218377 A1 | 10/2005 | Lawandy |
| 2005/0287348 A1 | 12/2005 | Faler et al. |
| 2006/0002875 A1 | 1/2006 | Winkler et al. |
| 2006/0060862 A1 | 3/2006 | Bawendi et al. |
| 2006/0068154 A1 | 3/2006 | Parce et al. |
| 2006/0083694 A1* | 4/2006 | Kodas et al. .................. 424/46 |
| 2006/0128845 A1 | 6/2006 | Emrick et al. |
| 2006/0165621 A1 | 7/2006 | Dubertret et al. |
| 2006/0216508 A1 | 9/2006 | Denisyuk et al. |
| 2006/0287437 A1 | 12/2006 | Ma et al. |
| 2006/0293409 A1 | 12/2006 | Sanchez et al. |
| 2007/0012928 A1 | 1/2007 | Peng et al. |
| 2007/0034833 A1* | 2/2007 | Parce et al. ............. 252/301.36 |
| 2007/0045777 A1* | 3/2007 | Gillies et al. .................. 257/613 |
| 2007/0063154 A1 | 3/2007 | Chen et al. |
| 2007/0090755 A1 | 4/2007 | Eida et al. |
| 2007/0096057 A1* | 5/2007 | Hampden-Smith et al. ............. 252/301.16 |
| 2007/0112101 A1 | 5/2007 | Choi et al. |
| 2007/0121129 A1 | 5/2007 | Eida et al. |
| 2007/0158611 A1 | 7/2007 | Oldenburg |
| 2007/0164661 A1 | 7/2007 | Kuma |
| 2007/0201056 A1 | 8/2007 | Cok et al. |
| 2007/0207186 A1 | 9/2007 | Scanlon et al. |
| 2007/0241661 A1 | 10/2007 | Yin |
| 2007/0265379 A1 | 11/2007 | Chen et al. |
| 2007/0269518 A1 | 11/2007 | Walline et al. |
| 2007/0281140 A1 | 12/2007 | Haubrich et al. |
| 2007/0290384 A1 | 12/2007 | Kodas et al. |
| 2008/0001124 A1 | 1/2008 | Hachiya et al. |
| 2008/0011956 A1 | 1/2008 | Burrell et al. |
| 2008/0029625 A1 | 2/2008 | Talton |
| 2008/0029710 A1 | 2/2008 | Sekiya et al. |
| 2008/0044746 A1 | 2/2008 | Anderson et al. |
| 2008/0070153 A1 | 3/2008 | Ioku et al. |
| 2008/0087190 A1 | 4/2008 | Iftime et al. |
| 2008/0090928 A1 | 4/2008 | Iftime et al. |
| 2008/0103250 A1* | 5/2008 | Carlini et al. .................. 524/588 |
| 2008/0121844 A1 | 5/2008 | Jang et al. |
| 2008/0165235 A1 | 7/2008 | Rolly et al. |
| 2008/0169753 A1 | 7/2008 | Skipor et al. |
| 2008/0173886 A1 | 7/2008 | Cheon et al. |
| 2008/0230750 A1 | 9/2008 | Gillies et al. |
| 2008/0246017 A1 | 10/2008 | Gillies et al. |
| 2008/0254920 A1 | 10/2008 | Oresky |
| 2008/0277626 A1* | 11/2008 | Yang et al. ............. 252/301.36 |
| 2009/0014685 A1 | 1/2009 | Justel et al. |
| 2009/0017268 A1 | 1/2009 | Skipor et al. |
| 2009/0021148 A1 | 1/2009 | Hachiya et al. |
| 2009/0036554 A1 | 2/2009 | Burke et al. |
| 2009/0059554 A1 | 3/2009 | Skipor et al. |
| 2009/0097898 A1 | 4/2009 | Iftime et al. |
| 2009/0152567 A1 | 6/2009 | Comerford et al. |
| 2009/0162011 A1 | 6/2009 | Coe-Sullivan et al. |

(56) References Cited

U.S. PATENT DOCUMENTS

| | | |
|---|---|---|
| 2009/0215208 A1 | 8/2009 | Coe-Sullivan et al. |
| 2009/0311336 A1 | 12/2009 | Jones |
| 2009/0324835 A1 | 12/2009 | Bonda et al. |
| 2010/0044635 A1 | 2/2010 | Breen et al. |
| 2010/0051870 A1 | 3/2010 | Ramprasad |
| 2010/0051898 A1 | 3/2010 | Kim et al. |
| 2010/0056485 A1 | 3/2010 | Park |
| 2010/0063201 A1 | 3/2010 | Yamamoto et al. |
| 2010/0113813 A1 | 5/2010 | Pickett et al. |
| 2010/0123155 A1 | 5/2010 | Pickett et al. |
| 2010/0167011 A1 | 7/2010 | Dubrow |
| 2010/0264371 A1 | 10/2010 | Nick |
| 2010/0265307 A1 | 10/2010 | Linton et al. |
| 2010/0275807 A1 | 11/2010 | Landry et al. |
| 2010/0283014 A1 | 11/2010 | Breen et al. |
| 2011/0089375 A1 | 4/2011 | Bawendi et al. |
| 2012/0141774 A1 | 6/2012 | Abrami et al. |
| 2012/0256134 A1 | 10/2012 | Nick |
| 2012/0256141 A1 | 10/2012 | Nick et al. |

OTHER PUBLICATIONS

Boev, V.I., "Formation of Cds Nanoparticles by Gas-Diffusion Method in Sol-Gel Derived Ureasilicate Matrix", *Material Letters* 60, (2006) 3793-3796.

Budriene, S., et al., "Preparation of Lipophillic Dye-Loaded (Vinyl Alcohol) Microcapsules and Their Characteristics", *Chemija (Vilnius)*, 2002, T. 13, Nr. 2, 103-106.

Chatterjee, J., et al., "Synthesis of Polyethylene Magnetic Nanoparticles", *European Cells and Materials*, vol. 3, Suppl. 2, 2002 (pp. 98-101).

Dabbousi, B.O., et al., "(CdSe)ZnS Core-Shell Quantum Dots: Synthesis and Characterization of a Size Series of Highly Luminescent Nanocrystallites", *J. Phys. Chem.* 101, 9463 (1997).

De Mello, J.C., et al., "An Improved Experimental Determination of External Photoluminescence Quantum Efficiency", *Advanced Materials* 9(3):230(1997).

Dubertret, B. et al. "In vivo Imaging Of Quantum Dots Encapsulated in Phospholipid Micelles", *Science* vol. 298, Nov. 2002 (pp. 1759-1762).

Garner, B., et al., "Electric Field Enhanced Photoluminescence of CdTe Quantum Dots Encapsulated in Poly (N-Isopropylaciylamide) Nano-Spheres", *Optics Express* vol. 16, No. 24, 19410-19418 (2008).

Iwamoto, "Production of Gold Nanoparticles-Polymer Composite by Quite Simple Method", *Eur. Phys. J.D.* 24,365-367 (2003).

Jayaweera, P.V.V., et al., "Displacement Currents in Semiconductor Quantum Dots Embedded Dielectric Media: A Method for Room Temperature Photon Detection", *Applied Physics Letters*, 91 063114 (2007).

Lee, J. et al. "Full Color Emission from II-VI Semiconductor Quantum Dot-Polymer Composites", *Advanced Materials*, 2000, 12, No. 15, Aug. 2.

Mueller, W., et al. "Hydrophobic Shell Loading of Pb-*b*-PEO Vesicles", *Macromolecules* 2009 42, 357-361.

Murray, Christopher, Ph.D. Thesis entitled "Synthesis and Characterization of II-V1 Quantum Dots and Their Assembly Into 3-D Quantum Dot Superlattices", Massachusetts Institute of Technology, Sep. 1995.

Murray, C. B., et al., "Synthesis and Characterization of Nearly Monodisperse CdE (E=S, Se, Te) Semiconductor Nanocrystallites", *J. Am. Chem. Soc.* 1993, 115, 8706.

Nikolic, M., Dissertation entitled Encapsulation of Nanoparticles within Poly(ethylene oxide) Shell, University of Hamburg 2007.

PCT/US2007/08873 Search Report and Written Opinion—QD Vision, Inc., mailed Jan. 11, 2008.

PCT/US2008/07901 Search Report and Written Opinion—QD Vision, Inc., mailed Jan. 21, 2009.

PCT/US2008/07902 Search Report and Written Opinion—QD Vision, Inc., mailed Sep. 11, 2008.

PCT/US2009/001372 Search Report and Written Opinion—QD Vision, Inc., mailed Oct. 29, 2009.

PCT/US2010/48285 Search Report and Written Opinion—QD Vision, Inc., mailed Nov. 8, 2010.

PCT/US2010/48291 Search Report and Written Opinion—QD Vision, Inc., mailed Oct. 22, 2010.

Shojaei-Zadeh, S., et al., "Encapsulation of Multicolored Quantum Dots in Polystyrene Beads Using Microfluidic Devices", American Institute of Chemical Engineers, 2008 Annual Meeting—Conference Proceedings, Engineering Sciences and Fundamentals.

Thomas, V., et al., "Review on Polymer, Hydrogel and Microgel Metal Nanocomposites: A facile Nanotechnological Approach", *Journal of Macromolecular Science*, (2008) 45, 107-119.

Wax Facts, www.npra.org/ourIndustry/wax Facts (undated).

Ye, Xinyu, et al., "Zinc Sulfide Nanocrystals in Paraffin Liquid Open to Air: Preparation, Structure, and Mechanism", *Chemistiy Letters* vol. 36, No. 11 (2007) 1376-1377.

Zwiller, V., et al., Quantum Optics With Single Quantum Dot Devices, *New Journal of Physics*, 6 (2004) 96.

Wang, et al., "Composite Photonic Crystals from Semiconductor Nanocrystal/Polyelectrolyte-Coated Colloidal Spheres", *Chem. Mater.*, 15 (2003), pp. 2724-2729.

\* cited by examiner

PARTICLES INCLUDING NANOPARTICLES DISPERSED IN SOLID WAX, METHOD AND USES THEREOF

This application is a continuation of commonly owned International Application No. PCT/US2009/001372 filed 4 Mar. 2009, which was published in the English language as PCT Publication No. WO2009/145813 on 3 Dec. 2009, which International Application claims priority to U.S. Application No. 61/033,729 filed 4 Mar. 2008; each of the foregoing hereby being incorporated herein by reference in its entirety.

TECHNICAL FIELD OF THE INVENTION

The present invention relates to the technical field of nanotechnology.

SUMMARY OF THE INVENTION

More particularly, the present invention relates to a particle comprising nanoparticles encapsulated within a host material, powders, formulations, compositions, and coatings including same, uses thereof, and methods.

In accordance with one aspect of the present invention there is provided a particle comprising nanoparticles with light-emissive properties included in a host material comprising a wax.

In certain embodiments, the particle has at least one dimension in the range from about 0.5 μm to about 100 μm. In certain embodiments, the particle has at least one dimension in the range from about 0.5 μm to about 50 μm.

The concentration of nanoparticles in the host material or particle can be varied. In certain embodiments, the nanoparticles can be included in the host material in an amount of at least about 0.01 weight percent. In certain embodiments, the nanoparticles can be included in the host material in an amount in a range from about 0.01 to about 50 weight percent. In certain embodiments, the nanoparticles can be included in the host material in an amount in a range from about 0.01 to about 30 weight percent. In certain embodiments, the nanoparticles can be included in the host material in an amount in a range from about 0.1 to about 20 weight percent. In certain embodiments, the nanoparticles can be included in the host material in an amount in a range from about 1 to about 10 weight percent. The weight percent of the nanoparticles included in a particle is determined based on the weight of the nanoparticles without regard to any ligand(s) that may be attached thereto.

In certain embodiments, the host material comprises a solid wax. In certain embodiments, the host material comprises a semi-solid wax. In certain embodiments, the host material comprises a mixture of waxes. In certain embodiments, the wax is non-biodegradable. In certain embodiments, the wax is optically transparent. In certain embodiments, the wax is optically transparent to excitation light used to optically excite the nanoparticles. In certain embodiments, the wax is optically transparent to light emitted from the light-emissive nanoparticles. In certain embodiments, the wax is optically transparent to both the excitation light and light emitted from the light-emissive nanoparticles.

Nanoparticles with light-emissive properties are discussed below.

In certain embodiments, at least a portion of the nanoparticles include a core comprising a first semiconductor material and a shell disposed over at least a portion of an outer surface of the core, the shell comprising a second semiconductor material.

In certain embodiments, at least a portion of the nanoparticles includes one or more ligands attached to an outer surface thereof.

In certain embodiments wherein at least a portion of the nanoparticles include ligands attached to an outer surface thereof, the ligands are selected to be chemically compatible with the host material.

In certain preferred embodiments, the nanoparticles comprise semiconductor nanocrystals. In certain embodiments, the semiconductor nanocrystals include a core comprising a first semiconductor nanocrystalline material and a shell disposed over at least a portion of an outer surface of the core, the shell comprising a second semiconductor nanocrystalline material. In certain embodiments, at least a portion of the semiconductor nanocrystals includes one or more ligands attached to an outer surface thereof.

In accordance with another aspect of the present invention, there is provided a powder comprising a plurality of particles in accordance with the invention.

In certain embodiments, the powder has a predetermined particle size distribution. A predetermined particles size distribution can be achieve by screening or by other techniques readily ascertainable by one of ordinary skill in the relevant art.

In certain embodiments, two or more populations of particles are included in the powder, wherein at least one population of particles includes nanoparticles that emit light at a wavelength that is distinct from that emitted by nanoparticles included in another population of particles.

In accordance with another aspect of the present invention, there is provided a formulation comprising one or more particles in accordance with the invention and a solid or liquid medium.

In certain embodiments, the particles are present in the formulation in an amount of at least about 0.1 weight percent based on the weight of the medium. In certain embodiments, the particles are present in the formulation in an amount of at least about 0.1 to about 50 weight percent based on the weight of the medium. In certain embodiments, the particles are present in the formulation in an amount of at least about 0.1 to about 20 weight percent based on the weight of the medium. In certain embodiments, the particles are present in the formulation in an amount of at least about 0.1 to about 10 weight percent based on the weight of the medium. In certain embodiments, the particles are present in the formulation in an amount of at least about 0.1 to about 5 weight percent based on the weight of the medium.

In certain embodiments, the medium comprises a monomer, polymer, resin, film forming composition, and/or mixtures of the foregoing.

In certain embodiments, the formulation further includes one or more additives. In certain embodiments, the one or more additives can include a phosphor, a colorant, a scatterer, a binder, a surfactant, a UV absorber, and/or a mixture of one or more thereof.

In accordance with another aspect of the present invention there is provided a film prepared from a formulation in accordance with the invention.

In certain embodiments, the film further comprises a monomer, polymer, resin, film forming composition, and/or mixtures of the foregoing.

In certain embodiments, a film further includes one or more additives. In certain embodiments, the one or more additives can include a phosphor, a colorant, a scatterer, a binder, a surfactant, a UV absorber, and/or a mixture of one or more thereof.

In accordance with another aspect of the present invention there is provided a coating comprising a film prepared from a plurality of particles in accordance with the invention.

In accordance with another aspect of the present invention, there is provided a composition comprising one or more particles in accordance with the invention dispersed in a second host material.

In certain embodiments, the second host material comprises a polymer. In certain embodiments, the second host material comprises a monomer. In certain embodiments, the second host material comprises a resin.

In accordance with other aspects of the invention, there is provided a device including a particle in accordance with the invention.

In accordance with other aspects of the invention, there is provided a device including a coating in accordance with the invention.

In accordance with other aspects of the invention, there is provided a device including a composition in accordance with the invention.

In accordance with other aspects of the invention, there is provided a device including a powder in accordance with the invention.

In accordance with another aspect of the present invention, there is provided a method of preparing encapsulated light-emissive nanoparticles comprising adding light-emissive nanoparticles to a melted host material comprising a wax to form a mixture, solidifying the mixture, and size-reducing the solidified mixture to provide particles including light-emissive nanoparticles dispersed in the host material.

In certain embodiments, the size-reducing step comprises cryogenic grinding or milling.

In certain embodiments, the mixture is solidified by cooling at a rate sufficiently quick to prevent phase separation of the nanoparticles and the wax. In certain embodiments, the mixture is solidified by cooling in liquid nitrogen.

The foregoing, and other aspects and embodiments described herein and contemplated by this disclosure all constitute embodiments of the present invention.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

For a better understanding to the present invention, together with other advantages and capabilities thereof, reference is made to the following disclosure and appended claims in connection with the above-described drawings.

DESCRIPTION OF THE INVENTION

More particularly, the present invention relates to a particle comprising nanoparticles encapsulated within a host material, powders, formulations, compositions, and coatings including same, uses thereof, and methods.

In certain embodiments, the nanoparticles can have light-emissive properties. In certain embodiments, the nanoparticles comprise semiconductor nanocrystals. Nanoparticles and semiconductor nanocrystals are discussed further below.

In certain embodiments, the nanoparticles can include one or more ligands attached to the outer surface thereof.

Preferably the host material comprises a solid material. In certain embodiments, the host material can be selected to provide environmental stability to the nanoparticles. For example, a preferred host material can have characteristics which protect the nanoparticles included therein from environmental factors that can adversely affect the nanoparticles. Examples of such factors include, without limitation, oxygen, water, etc.

In certain embodiments, the host material can be optically transparent.

In certain embodiments, the host matrix is not biodegradable.

In one embodiment of the present invention, there is provided a particle comprising a host material including nanoparticles dispersed therein. In certain embodiments, the nanoparticles are dispersed throughout the host material. In certain embodiments, the nanoparticles are substantially uniformly dispersed throughout the host material. In certain embodiments, the nanoparticles are dispersed throughout the particle. In certain embodiments, the nanoparticles are substantially uniformly dispersed throughout the particle.

In certain embodiments, the particle can have a size in a range from about 0.5 to about 100 microns. In certain embodiments, the particle can have a size in a range from about 0.5 to about 80 microns. In certain embodiments, the particle can have a size in a range from about 0.5 to about 60 microns. In certain embodiments, the particle can have a size in a range from about 0.5 to about 50 microns. In certain embodiments, the particle can have a size in a range from about 0.5 to about 40 microns. In certain embodiments, the particle can have a size in a range from about 0.5 to about 20 microns. In certain embodiments, the particle can have a size in a range from about 0.5 to about 10 microns. In certain embodiments, the particle can have a size in a range from about 1 to about 50 microns. In certain embodiments, the particle can have a size in a range from about 1 to about 30 microns. In certain embodiments, the particle can have a size in a range from about 1 to about 20 microns. Particles in accordance with certain embodiments of the invention that are micron sized can facilitate inclusion of nanoparticles in formulations, other compositions, processes, and applications, while avoiding the handling of nano-sized materials.

The concentration of the nanoparticles in the host material or particle can be varied. In certain embodiments, the nanoparticles can be included in the host material in an amount of at least about 0.01 weight percent. In certain embodiments, the nanoparticles can be included in the host material in an amount in a range from about 0.01 to about 50 weight percent. In certain embodiments, the nanoparticles can be included in the host material in an amount in a range from about 0.01 to about 30 weight percent. In certain embodiments, the nanoparticles can be included in the host material in an amount in a range from about 0.1 to about 20 weight percent. In certain embodiments, the nanoparticles can be included in the host material in an amount in a range from about 1 to about 10 weight percent.

In accordance with another embodiment of the invention, there is provided a powder comprising a plurality of particles in accordance with the present invention. In certain embodiments, the powder has a predetermined particle size distribution. A predetermined particles size distribution can be achieve by screening or by other techniques readily ascertainable by one of ordinary skill in the relevant art.

In another embodiment of the invention, there is provided a formulation comprising a plurality of particles in accordance with the present invention. In certain embodiments, the formulation can further comprise a liquid. The liquid can be aqueous or non-aqueous. The liquid can be polar or non-polar. In certain embodiments, a formulation can include one or more monomers, polymers, resins, and/or other film forming compositions.

Examples of polymers and resins include, for example and without limitation, polyethylene, polypropylene, polystyrene, polyethylene oxide, polysiloxane, polyphenylene, polythiophene, poly(phenylene-vinylene), polysilane, polyethylene terephthalate and poly(phenylene-ethynylene), polymethylmethacrylate, polycarbonate, epoxy, and other epoxies. Other polymers and resins suitable for the formulation end-use application can further be used.

Examples of monomers include, for example and without limitation, monomer precursors for the above listed polymer examples.

In certain embodiments, a formulation can optionally include one or more additives, including, but not limited to, phosphors, colorants, scatterers, binders, surfactants, defoaming agents, UV absorbers, etc., and/or mixtures of one or more of the foregoing.

In certain embodiments of a formulation including a liquid, the host material preferably has a refractive index that matches, or is approximately the same as, that of the formulation after the liquid is removed.

In certain embodiments, the host matrix included in the particles is insoluble in the liquid and other components of the formulation. In certain embodiments, the host matrix included in the particles is not chemically reactive with any liquid and/or other components of the formulation.

In certain embodiments wherein at least a portion of the nanoparticles includes one or more ligands attached to an outer surface thereof, the host material is selected to be chemically compatible with the ligands.

Encapsulating nanoparticles in a host material can advantageously simplify the processing and/or use of the nanoparticles, e.g., in other formulations, compositions, and other products and end-use applications. For example, preparation of a formulation involving nanoparticles having different compositions can be simplified when the nanoparticles are encapsulated in a host material before inclusion in the formulation. This is particularly the case in embodiments wherein each of the different composition nanoparticles is included in a host material that is the same for each of the different nanoparticles.

Examples of preferred host materials for inclusion in particles for use in a formulation (e.g., that is useful to prepare a coating) include hydrocarbon wax, which is available in different molecular weight versions. Low molecular weight versions are called paraffin wax. Fischer-Tropsch wax is an example of a medium molecular weight version. Polyethylene wax is an example of a high molecular weight version. Melting points can range from 50° C. to 130° C. Straight chain hydrocarbon waxes will be very compatible with nanoparticles including one or more ligands comprising a straight chain alkane ligand. Above certain molecular weight, these waxes are insoluble in most solvents. Lower molecular weight chains are preferred host materials for nanoparticles comprising semiconductor nanocrystals. (Higher molecular weight chains can be more brittle which can make particle size reduction easier.) The index of refraction of these waxes generally are in a range from 1.51 to 1.54, similar to the 1.49 value for PMMA. It is uncolored to milky white. While polyethylene is less than an optimum $O_2$ barrier, in certain uses it is preferred because it is not biodegradable and it is resistant to the liquids and/or components included in the formulation.

Other waxes can be used as host materials, and there are many methods useful to obtain the desired particle size.

In certain embodiments, solid waxes are used as host materials. In certain embodiments, semi-solid waxes are used as host materials.

In certain embodiments, a formulation of the invention can be used an ink.

In accordance with another embodiment of the invention, there is provided a coating comprising particles of the invention. In certain embodiments, the coating further comprises a one or more monomers, polymers, resins, and/or other film forming compositions. In certain embodiments, a coating can optionally further include one or more additives, including, but not limited to, phosphors, colorants, scatterers, binders, surfactants, UV absorbers, etc., and/or mixtures of one or more of the foregoing.

Examples of polymers and resins include, for example and without limitation, polypropylene, polystyrene, polyethylene oxide, polysiloxane, polyphenylene, polythiophene, poly(phenylene-vinylene), polysilane, polyethylene terephthalate and poly(phenylene-ethynylene, epoxy polymethylmethacrylates), epoxy, and other epoxies. Other polymers and resins suitable for the coating end-use application can further be used.

Examples of monomers include, for example and without limitation, monomer precursors for the above listed polymer examples.

In certain embodiments, a coating can be prepared by applying a formulation in accordance with an embodiment of the invention that includes a liquid to a surface and removing the liquid. In certain embodiments, the liquid can be removed from the applied formulation by evaporation, heating, or other suitable techniques. In certain embodiments, the formulation can be applied to the surface by screen-printing, contact printing, inkjet printing, gravure coating, roll coating, or other suitable techniques. In certain embodiments, the coating can be patterned or unpatterned.

In another embodiment of the invention, a coating can be formed by adding nanoparticles to melted host material (that may optionally include other additives or components), and applying the mixture to a surface to be coated.

In accordance with another embodiment of the invention, there is provided a method for making the above-described particles of the invention. The method comprises adding nanoparticles to melted host material, solidifying the mixture, and size-reducing the solidified mixture to provide particles including nanoparticles dispersed in the host material. Examples of suitable size-reduction techniques include, but are not limited to, cryogenic grinding or milling.

Light-emissive nanoparticles can confine electrons and holes and have a photoluminescent property to absorb light and re-emit different wavelength light. Color characteristics of emitted light from light-emissive nanoparticles depend on the size and chemical composition of the nanoparticles.

In certain embodiments, light-emissive nanoparticles include at least one type of light-emissive nanoparticle with respect to chemical composition and size. The type(s) of light-emissive nanoparticles included in various aspects or embodiments of the inventions contemplated by this disclosure are determined by the wavelength of light to be converted and the wavelengths of the desired light output. In certain embodiments, two or more types of light-emissive nanoparticles can be used that emit light at the same or different wavelengths.

In certain embodiments, light-emissive nanoparticles preferably include a shell and/or a ligand on a surface thereof. A shell and/or ligand can serve to passivate non-radiative defect sites, and to prevent agglomeration or aggregation to overcome the Van der Waals binding force between the nanoparticles. In certain embodiments, the ligand preferably comprises a material having an affinity for the host material in which light-emissive nanoparticles are included. As discussed herein, in certain embodiments, a shell comprises an inorganic shell. Ligands and shells are further discussed below.

In certain embodiments, a particle of the invention can include nanoparticles selected to emit at a predetermined wavelength or wavelength band for the desired color upon absorption of excitation light.

In certain embodiments, a particle of the invention can include a mixture of two or more nanoparticles, each of which is selected to emit at a predetermined wavelength or wavelength band which is distinct from that of the other(s) when excited by optical energy from one or more light sources for the desired light output.

Particles, powders, compositions, formulations and coatings taught herein can be useful for altering the wavelength of at least a portion of light emitted from an excitation light source.

In certain embodiments, nanoparticles have an average particle size in a range from about 1 to about 1000 nanometers (nm), and preferably in a range from about 1 to about 100 nm. In certain embodiments, nanoparticles have an average particle size in a range from about 1 to about 20 nm. In certain embodiments, nanoparticles have an average particle size in a range from about 1 to about 10 nm.

In certain embodiments, a nanoparticle with light-emissive properties comprises a semiconductor nanocrystal. In certain embodiments, a semiconductor nanocrystal has an average particle size in a range from about 1 to about 20 nm, and preferably from about 1 to about 10 nm.

The semiconductor forming the semiconductor nanocrystals can comprise a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, an alloy including any of the foregoing, and/or a mixture including any of the foregoing, including ternary and quaternary mixtures or alloys. A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

Examples of the shape of semiconductor nanocrystals and other nanoparticles can include sphere, rod, disk, other shapes, or mixtures thereof.

One example of a method of manufacturing a semiconductor nanocrystal is a colloidal growth process. Colloidal growth occurs by injection an M donor and an X donor into a hot coordinating solvent. One example of a preferred method for preparing monodisperse semiconductor nanocrystals comprises pyrolysis of organometallic reagents, such as dimethyl cadmium, injected into a hot, coordinating solvent. This permits discrete nucleation and results in the controlled growth of macroscopic quantities of semiconductor nanocrystals. The injection produces a nucleus that can be grown in a controlled manner to form a semiconductor nanocrystal. The reaction mixture can be gently heated to grow and anneal the semiconductor nanocrystal. Both the average size and the size distribution of the semiconductor nanocrystals in a sample are dependent on the growth temperature. The growth temperature necessary to maintain steady growth increases with increasing average crystal size. The semiconductor nanocrystal is a member of a population of semiconductor nanocrystals. As a result of the discrete nucleation and controlled growth, the population of semiconductor nanocrystals that can be obtained has a narrow, monodisperse distribution of diameters. The monodisperse distribution of diameters can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

In certain embodiments, nanoparticles can comprise semiconductor nanocrystals including a core comprising a first semiconductor material and a shell comprising a second semiconductor material, wherein the shell is disposed over at least a portion of a surface of the core. A semiconductor nanocrystal including a core and shell is also referred to as a "core/shell" semiconductor nanocrystal.

For example, the semiconductor nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as semiconductor nanocrystal cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The shell can be a semiconductor material having a composition that is the same as or different from the composition of the core. The shell comprises an overcoat of a semiconductor material on a surface of the core semiconductor nanocrystal can include a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals. An overcoating process is described, for example, in U.S. Pat. No. 6,322, 901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell.

The narrow size distribution of the semiconductor nanocrystals allows the possibility of light emission in narrow spectral widths. Monodisperse semiconductor nanocrystals have been described in detail in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 for "Highly Luminescent Color-Selective Materials". The foregoing are hereby incorporated herein by reference in their entireties.

The process of controlled growth and annealing of the semiconductor nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened. The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. The X donor can be a chalcogenide donor or a pnictide donor, such as a phosphine chalcogenide, a bis(silyl) chalcogenide, dioxygen, an ammonium salt, or a tris(silyl)pnictide. Suitable X donors include dioxygen, bis (trimethylsilyl)selenide ((TMS)$_2$Se), trialkyl phosphine selenides such as (tri-noctylphosphine)selenide (TOPSe) or (tri-n-butylphosphine)selenide (TBPSe), trialkyl phosphine tellurides such as (tri-n-octylphosphine)telluride (TOPTe) or hexapropylphosphorustriamide telluride (HPPTTe), bis(trimethylsilyl)telluride ((TMS)$_2$Te), bis(trimethylsilyl)sulfide ((TMS)$_2$S), a trialkyl phosphine sulfide such as (tri-noctylphosphine)sulfide (TOPS), an ammonium salt such as an ammonium halide (e.g., NH$_4$Cl), tris(trimethylsilyl)phosphide ((TMS)$_3$P), tris(trimethylsilyl)arsenide ((TMS)$_3$As), or tris(trimethylsilyl)antimonide ((TMS)$_3$Sb). In certain embodiments, the M donor and the X donor can be moieties within the same molecule.

A coordinating solvent can help control the growth of the semiconductor nanocrystal. The coordinating solvent is a compound having a donor lone pair that, for example, has a lone electron pair available to coordinate to a surface of the growing semiconductor nanocrystal. Solvent coordination can stabilize the growing semiconductor nanocrystal. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the semiconductor nanocrystal production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri(dodecyl)phosphine, dibutyl-phosphite, tributyl phosphite, trioctadecyl phosphite, trilauryl phosphite, tris(tridecyl)phosphite, triisodecyl phosphite, bis(2-ethylhexyl)phosphate, tris(tridecyl) phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. In certain embodiments, technical grade TOPO can be used.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the semiconductor nanocrystals can be further refined by size selective precipitation with a poor solvent for the semiconductor nanocrystals, such as methanol/butanol as described in U.S. Pat. No. 6,322,901. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected semiconductor nanocrystal population preferably has no more than a 15% rms deviation from mean diameter, more preferably 10% rms deviation or less, and most preferably 5% rms deviation or less.

In certain embodiments, semiconductor nanocrystals preferably have ligands attached thereto.

In certain embodiment, the ligands can be derived from the coordinating solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal. In certain embodiments, semiconductor nanocrystals can alternatively be prepared with use of non-coordinating solvent(s).

More specifically, the coordinating ligand can have the formula:

wherein k is 2, 3 4, or 5, and n is 1, 2, 3, 4 or 5 such that k−n is not less than zero; X is O, O—S, O—Se, O—N, O—P, O—As, S, S=O, $SO_2$, Se, Se=O, N, N=O, P, P=O, C=O As, or As=O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

A suitable coordinating ligand can be purchased commercially or prepared by ordinary synthetic organic techniques, for example, as described in J. March, Advanced Organic Chemistry, which is hereby incorporated by reference in its entirety.

Other ligands are described in U.S. patent application Ser. No. 10/641,292 for "Stabilized Semiconductor Nanocrystals", filed 15 Aug. 2003, which issued on 9 Jan. 2007 as U.S. Pat. No. 7,160,613, which is hereby incorporated herein by reference in its entirety.

The emission from a nanoparticle capable of emitting light (e.g., a semiconductor nanocrystal) can be a narrow Gaussian emission band that can be tuned through the complete wavelength range of the ultraviolet, visible, or infra-red regions of the spectrum by varying the size of the nanoparticle, the composition of the nanoparticle, or both. For example, a semiconductor nanocrystal comprising CdSe can be tuned in the visible region; a semiconductor nanocrystal comprising InAs can be tuned in the infra-red region. The narrow size distribution of a population of nanoparticles capable of emitting light (e.g., semiconductor nanocrystals) can result in emission of light in a narrow spectral range. The population can be monodisperse preferably exhibits less than a 15% rms (root-mean-square) deviation in diameter of such nanoparticles, more preferably less than 10%, most preferably less than 5%. Spectral emissions in a narrow range of no greater than about 75 nm, preferably 60 nm, more preferably 40 nm, and most preferably 30 nm full width at half max (FWHM) for such nanoparticles that emit in the visible can be observed. IR-emitting nanoparticles can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting nanoparticle diameters decreases.

For example, semiconductor nanocrystals can have high emission quantum efficiencies such as greater than 10%, 20%, 30%, 40%, 50%, 60%, 70%, 80%, or 90%.

The narrow FWHM of semiconductor nanocrystals can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A pattern including more than one size of semiconductor nanocrystal can emit light in more than one narrow range of wavelengths. The color of emitted light perceived by a viewer can be controlled by selecting appropriate combinations of semiconductor nanocrystal sizes and materials. The degeneracy of the band edge energy levels of semiconductor nanocrystals facilitates capture and radiative recombination of all possible excitons.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

Other materials, techniques, methods, applications, and information that may be useful with the present invention are described in, International Application No. PCT/US2007/008873, filed Apr. 9, 2007, of Coe-Sullivan et al., for "Composition Including Material, Methods Of Depositing Material, Articles Including Same And Systems For Depositing Material" which published as WO2007/117698; International Application No. PCT/US2007/09255, filed Apr. 13, 2007, of Anc, et al., for "Methods Of Depositing Material, Methods Of Making A Device, And Systems And Articles For Use In Depositing Material" which published as WO2007/120877; International Application No. PCT/US2007/14711, filed Jun. 25, 2007, of Coe-Sullivan, for "Methods For Depositing Nanomaterial, Methods For Fabricating A Device, And Methods For Fabricating An Array Of Devices" which published as WO2008/108798; International Application No. PCT/US2007/14705, filed Jun. 25, 2007, of Coe-Sullivan, et al., for "Methods For Depositing Nanomaterial, Methods For Fabricating A Device, Methods For Fabricating An Array Of Devices And Compositions" which published as WO2008/105792; International Application No. PCT/US2007/008705, filed Apr. 9, 2007, of Coe-Sullivan, et al., for "Methods And Articles Including Nanomaterial"; International Application No. PCT/US2007/014706, filed Jun. 25, 2007, of Coe-Sullivan, et al., for "Methods And Articles Including Nanomaterial" which published as WO2008/111947; International Application No. PCT/US2007/003525, filed Feb. 8, 2007, of Coe-Sullivan, et al., for "Displays Including Semiconductor Nanocrystals And Methods Of Making Same" which published as WO2007/092606; International Application No. PCT/US2007/008721, filed Apr. 9, 2007, of Cox, et al., for "Methods Of Depositing Nanomaterial & Methods Of Making A Device" which published as WO2007/117672; International Application No. PCT/US2007/019797, filed Sep. 12, 2007, of Coe-Sullivan, et al., for "A Composite Including Nanoparticles, Methods, And Products Including A Composite" which published as WO2008/033388; International Application No. PCT/US2007/019796, of Coe-Sullivan, et al., filed Sep. 12, 2007, for "Electroluminescent Display Useful For Displaying A Predetermined Pattern" which published as WO2008/085210; International Application No. PCT/US2007/24320, filed Nov. 21, 2007, of Clough, et al., for "Nanocrystals Including A Group Ma Element And A Group Va Element, Method, Composition, Device And Other Products" which published as WO2008/133660; U.S. Patent Application No. 60/971,887, filed Sep. 12, 2007, of Breen, et al., for "Functionalized Semiconductor Nanocrystals And Method"; U.S. Patent Application No. 60/992,598, filed Dec. 5, 2007, of Breen, et al., for "Functionalized Nanoparticles And Method"; International Application No. PCT/US2007/24305, filed Nov. 21, 2007, of Breen, et al., for "Blue Light Emitting Semiconductor Nanocrystal And Compositions And Devices Including Same" which published as WO2008/063652; International Application No. PCT/US2007/24306, filed Nov. 21, 2007, of Ramprasad, for "Semiconductor Nanocrystal And Compositions And Devices Including Same" which published as WO2008/063653; International Application No. PCT/US2007/013152, filed Jun. 4, 2007, of Coe-Sullivan, et al., for "Light-Emitting Devices And Displays With Improved Performance" which published as WO2007/143197; International Application No. PCT/US2007/24750, of Coe-Sullivan, et al., filed Dec. 3, 2007 "Improved Composites And Devices Including Nanoparticles" which published as WO2008/070028; International Application No. PCT/US2007/24310, filed Nov. 21, 2007, of Kazlas, et al., for "Light-Emitting Devices And Displays With Improved Performance" which published as WO2008/063653; International Application No. PCT/US2007/003677, filed Feb. 14, 2007, of Bulovic, et al., for "Solid State Lighting Devices Including Semiconductor Nanocrystals & Methods", U.S. Patent Application No. 61/016,227, filed 21 Dec. 2007, of Coe-Sullivan et al., for "Compositions, Optical Component, System Including an Optical Component, and Devices", and U.S. Patent Application No. 60/949,306, filed 12 Jul. 2007, of Linton, et al., for "Compositions, Methods For Depositing Nanomaterial, Methods For Fabricating A Device, And Methods For Fabricating An Array Of Devices". The disclosures of each of the foregoing listed patent documents are hereby incorporated herein by reference in their entireties.

Particles, powders, formulations, and coatings in accordance with various embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, a sign, lamps and various solid state lighting devices.

The present invention will be further clarified by the following non-limiting examples, which are intended to be exemplary of the present invention.

EXAMPLES

Example 1

CdSe/CdZnSe semiconductor nanocrystals with octadecylphosphonic acid, trioctyl phosphine oxide (TOPO), tri-octyl phosphine (TOP), and decyl amine ligands in hexane solution are added to the polyethylene in prill form in a septum glass vial. (The semiconductor nanocrystals were prepared generally according to procedure described in Example 5 in International Application No. PCT/US2007/013152, filed 4 Jun. 2007, of Coe-Sullivan, et al. for "Light-Emitting Devices And Displays With Improved Performance"; the scale of the reaction may have differed.) A magnetic stir bar is added. The vial is lowered into a stirred bath of silicone oil at 150° C. Vacuum is applied to the vial through a wide bore needle in the septum, and as the hexane boils off, the semiconductor nanocrystals transfer into the melting polymer phase. A decrease in the pressure in the vial indicates that the hexane has been removed, approximately 15-30 minutes. The vial is then removed from the bath and allowed to cool to room temperature. The remaining "puck" is brittle enough to be reduced to large particles (several mm) with a spatula. Further particle size reduction can be done by cryogenic grinding or milling.

In certain preferred embodiments, the vial and its contents are quenched quickly in liquid nitrogen. If not cooled or quenched quickly, phase separation may be observed.

Example of an Advantage of an Embodiment of the Present Invention

A formulation for the light emitting phosphor layer in an EL lamp is provided in U.S. Pat. No. 6,528,943 (Durel). The basic phosphor formulation contains phosphor, Kynar 9301 as a binder, Dimethylacetamide (DMAC) as a solvent, and several flow control agents. When it was attempted to formulate unencapsulated semiconductor nanocrystals into this formulation, the semiconductor nanocrystal emission was quickly quenched. However, when the encapsulated semiconductor nanocrystals in accordance with an embodiment of the invention, prepared as described above in Example 1, were added to a phosphor formulation generally similar to that described in U.S. Pat. No. 6,528,943 in an amount of approximately 8-10 weight percent of the phosphor formulation, the semiconductor nanocrystals remained bright, and a coating could be cured at 140° C. to remove the solvent without destroying the semiconductor nanocrystal emission.

Example 2

Scaled Up Process 1140 mg of CdSe/CdZnSe semiconductor nanocrystals with octadecylphosphonic acid, trioctyl phosphine oxide (TOPO), trioctyl phosphine (TOP), and decyl amine ligands (not including wt of ligands, excess salt) received in 36 ml of hexane (having a solution quantum yield ~70%). (The semiconductor nanocrystals were prepared generally according to the process described in Example 5 in International Application No. PCT/US2007/013152, filed 4 Jun. 2007, of Coe-Sullivan, et al. for "Light-Emitting Devices And Displays With Improved Performance", the scale of the reaction may have differed, and only one crash out or precipitation step was carried out after overcoating.) 22.8 grams of polyethylene (Baker-Petrolite Polywax 2000) was added and stirred magnetically. The flask was lowered into a silicone oil bath at 150° C. and heated under vacuum. After the hexane boiled off the polyethylene melted. The solution was kept under vacuum and at 150° C. for 30 minutes to make sure all of the hexane had been removed. The flask was removed from the bath, and transferred to liquid nitrogen to flash freeze the dispersion. The solid was then broken up with a mortar and pestle into millimeter-sized pieces. These pieces were further comminuted using a vibratory mill (Restch RT22). Approximately 2 cc aliquots of particles were added to 10 ml steel grinding jars with two steel 7 mm balls. The jars were cooled in liquid nitrogen, and then shaken for 1.5 minutes at 30 hertz. The comminuted powder was removed from the jars. Microscopic analysis showed many particles several microns in size up to a few particles as large as 45 µm. The resulting powder was pressed between glass slides and measured integrating sphere to have an EQE of 28%.

Figure 1:
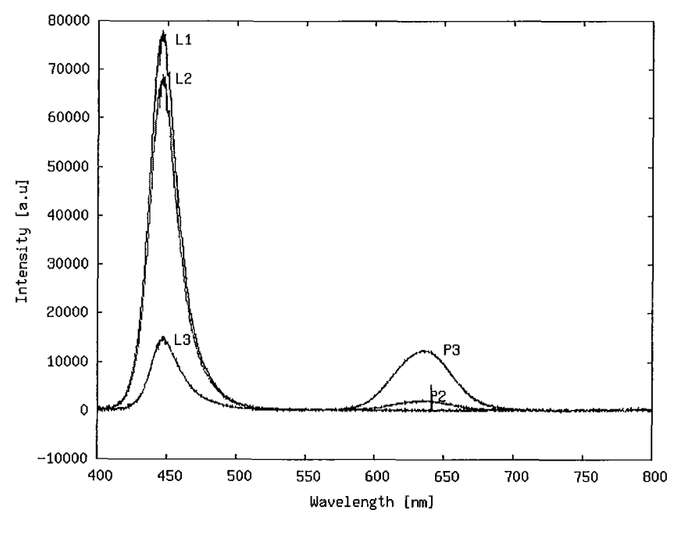
FIG. 1 depicts spectra to illustrate a method for measuring quantum efficiency.

The external photoluminescent (PL) quantum efficiency is generally measured using the method developed by Mello et al. (See Mello et al., Advanced Materials 9(3):230 (1997), which is hereby incorporated by reference in its entirety). The method uses a collimated 450 nm LED source, an integrating sphere and a spectrometer. Three measurements are taken. First, the LED directly illuminates the integrating sphere giving the spectrum labeled L1 below. Next, the PL sample is placed into the integrating sphere so that only diffuse LED light illuminates the sample giving the (L2+P2) spectrum below. Finally, the PL sample is placed into the integrating sphere so that the LED directly illuminates the sample (just off normal incidence) giving the (L3+P3) spectrum below. (See FIG. 1). After collecting the data, each spectral contribution (L's and P's) is computed. L1, L2 and L3 correspond to the sums of the LED spectra for each measurement and P2 and P3 are the sums associated with the PL spectra for 2nd and 3rd measurements. The following equation then gives the external PL quantum efficiency:

$$EQE=[(P3 \cdot L2) \text{ minus } (P2 \cdot L3)]/(L1 \cdot (L2 \text{ minus } L3))$$

As used herein, the singular forms "a", "an" and "the" include plural unless the context clearly dictates otherwise. Thus, for example, reference to an emissive material includes reference to one or more of such materials.

Applicant specifically incorporates the entire contents of all cited references in this disclosure by reference in their entirety. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

The invention claimed is:

1. A formulation comprising a solid medium and one or more solid wax particles, wherein a solid wax particle comprises semiconductor nanocrystal nanoparticles with light-emissive properties dispersed directly in a solid wax, wherein the solid wax particles are present in the formulation in amount of at least about 0.1 to about 50 weight present of the solid medium, wherein the solid medium comprises one or more of polypropylene, polystyrene, polyethylene oxide, polysiloxane, polyphenylene, polythiophene, poly(phenylene-vinylene), polysilane, polyethylene terephthalate and poly(phenylene-ethynylene), polymethylmethacrylate, polycarbonate, and an epoxy.

2. A formulation in accordance with claim 1 wherein the solid wax particles are present in the formulation in an amount of at least about 0.1 to about 20 weight percent based on the weight of the medium.

3. A formulation in accordance with claim 1 wherein the solid wax particles are present in the formulation in an amount of at least about 0.1 to about 10 weight percent based on the weight of the medium.

4. A formulation in accordance with claim 1 wherein the solid wax particles are present in the formulation in an amount of at least about 0.1 to about 5 weight percent based on the weight of the medium.

5. A formulation in accordance with claim 1 wherein the formulation comprising the solid medium and the one or more solid wax particles further includes one or more additives.

6. A formulation in accordance with claim 5 wherein the additive comprises a phosphor, a colorant, a scatterer, a binder, a surfactant, or a UV absorber.

7. A coating comprising a film prepared from a formulation in accordance with claim 1.

8. A coating in accordance with claim 7 wherein the formulation comprising the solid medium and the one or more solid wax particles further includes one or more additives, wherein the additive comprises a phosphor, a colorant, a scatterer, a binder, a surfactant, or a UV absorber.

* * * * *